US012757367B2

(12) United States Patent
Kang et al.

(10) Patent No.: US 12,757,367 B2
(45) Date of Patent: Oct. 6, 2026

(54) EPOXY DISPENSING DEVICE AND METHOD OF MOUNTING ELECTRONIC COMPONENT ON SUBSTRATE BY USING THE SAME

(71) Applicant: Electronics and Telecommunications Research Institute, Daejeon (KR)

(72) Inventors: Haechung Kang, Daejeon (KR); Eun Kyu Kang, Daejeon (KR); Jong Jin Lee, Daejeon (KR); Sangjin Kwon, Daejeon (KR); Won-Bae Kwon, Daejeon (KR); Dae Woong Moon, Daejeon (KR); Soo Yong Jung, Daejeon (KR); Gye Sul Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 140 days.

(21) Appl. No.: 18/930,350

(22) Filed: Oct. 29, 2024

(65) Prior Publication Data

US 2025/0159854 A1 May 15, 2025

(30) Foreign Application Priority Data

Nov. 10, 2023 (KR) ........................ 10-2023-0155170
Jun. 19, 2024 (KR) ........................ 10-2024-0079456

(51) Int. Cl.
*B32B 41/00* (2006.01)
*B05C 5/02* (2006.01)
*B05C 11/10* (2006.01)
*H05K 13/04* (2006.01)

(52) U.S. Cl.
CPC ........... *H05K 13/0469* (2013.01); *B05C 5/02* (2013.01); *B05C 11/1002* (2013.01)

(58) Field of Classification Search
CPC .... H05K 13/0469; B05C 5/02; B05C 11/1002
USPC .................... 156/60, 64, 350, 351, 378, 379
See application file for complete search history.

(56) References Cited

U.S. PATENT DOCUMENTS

| | | | |
|---|---|---|---|
| 9,042,740 | B2 | 5/2015 | Han et al. |
| 10,268,004 | B2 | 4/2019 | Han et al. |
| 2004/0141109 | A1 | 7/2004 | Wada et al. |

FOREIGN PATENT DOCUMENTS

| | | | |
|---|---|---|---|
| KR | 10-2017-0089053 | A | 8/2017 |
| KR | 10-1880072 | B1 | 7/2018 |
| KR | 10-2436109 | B1 | 8/2022 |

*Primary Examiner* — Michael N Orlando
*Assistant Examiner* — Joshel Rivera
(74) *Attorney, Agent, or Firm* — NSIP Law

(57) ABSTRACT

An epoxy dispensing device is provided. The epoxy dispensing device includes a cylinder configured to accommodate epoxy, a lower cover configured to seal a lower portion of the cylinder, and a pin disposed under the lower cover, wherein the pin pushes up the lower cover to coat the epoxy on a lower surface of an electronic component mounted in a dispensing port formed in an upper portion of the cylinder.

11 Claims, 11 Drawing Sheets

THE RELATED ART

THE RELATED ART

THE RELATED ART

THE RELATED ART

EPOXY DISPENSING DEVICE AND METHOD OF MOUNTING ELECTRONIC COMPONENT ON SUBSTRATE BY USING THE SAME

CROSS-REFERENCE TO RELATED APPLICATIONS

This application claims the benefit of the Korean Patent Application Nos. 10-2023-0155170 filed on Nov. 10, 2023, and 10-2024-0079456 filed on Jun. 19, 2024, which are hereby incorporated by reference as if fully set forth herein.

BACKGROUND

Field of the Invention

The present disclosure relates to an epoxy dispensing device, and more particularly, to an epoxy dispensing device which may dispense epoxy to a lower portion of an electronic component in an electronic component mounting process of an optical transceiver.

Discussion of the Related Art

An electronic component mounting process of an optical transceiver of the related art dispenses epoxy to a substrate surface, on which electronic components are to be mounted, through a top down nozzle, and places the electronic components at the dispensed epoxy, and then, fixes the electronic components to the substrate surface through an epoxy curing process.

FIGS. 1 to 4 are diagrams for describing a problem of an electronic component mounting process of the related art.

Referring to FIGS. 1 to 4, as optical transceivers are miniaturized and are highly integrated, an interval between electronic components 21 and 22 mounted on a substrate 10 narrows progressively. Due to this, in a case where another electronic component is mounted at a mounting position A between the electronic components 21 and 22 which form a narrow interval, a physical contact between a dispensing port of a nozzle 30 and the electronic components 21 and 22 may occur, causing the damage of the electronic components 21 and 22. Therefore, as illustrated in FIG. 2, a dispensing port height of the nozzle 30 should be raised, and epoxy 31 should be coated at the mounting position A at a raised height. In this case, as illustrated in FIG. 3, as the dispensing port height of the nozzle 30 is progressively raised, the epoxy 31 may be non-uniformly coated on a surface of the substrate 10 corresponding to the mounting position A. As illustrated in FIG. 4, an electronic component 40 may be disposed at the non-uniformly coated epoxy 31, and then, in a case which cures the epoxy 31, a phenomenon where the electronic component 40 is finely twisted may occur due to an uneven epoxy shrinkage of the epoxy 31. Due to this, an abnormal operation of an optical transceiver occurs, and a yield rate is reduced in a process of producing a number of optical transceivers.

SUMMARY

An aspect of the present disclosure is directed to providing an epoxy dispensing device and a method of mounting an electronic component on a substrate by using the epoxy dispensing device, which may precisely coat epoxy on a lower portion of an electronic component and may then mount an epoxy-coated electronic component on a substrate, in a process of mounting the electronic component including an optical lens on the substrate, and thus, may decrease an error occurring in a mounting process of a miniaturized electronic component and may shorten a process time.

To achieve these and other advantages and in accordance with the purpose of the invention, as embodied and broadly described herein, there is provided an epoxy dispensing device including: a cylinder configured to accommodate epoxy; a lower cover configured to seal a lower portion of the cylinder; and a pin disposed under the lower cover, wherein the pin pushes up the lower cover to coat the epoxy on a lower surface of an electronic component mounted in a dispensing port formed in an upper portion of the cylinder.

In an embodiment, the lower cover may include an elastic material.

In an embodiment, a width of the dispensing port may be greater than a width of an internal space of the cylinder.

In an embodiment, a dispensing amount of the epoxy coated on the lower surface of the electronic component may be determined based on a lift distance of the pin.

In an embodiment, the epoxy dispensing device may further include a driving device configured to control an ascending motion of the pin.

In another aspect of the present invention, there is provided a method of mounting an electronic component on a substrate by using an epoxy dispensing device, the method including: a step of mounting an electronic component in a dispensing port formed in an upper portion of an epoxy dispensing cylinder; a step of pushing up a lower cover formed under the epoxy dispensing cylinder by using a pin to dispense the epoxy through the dispensing port; a step of coating the epoxy on a lower surface of the electronic component mounted in the dispensing port by using the dispensed epoxy; and a step of moving the epoxy-coated electronic component to a mounting position of the electronic component by using a pickup device, and then, curing the epoxy coated on the lower surface of the electronic component with ultraviolet to fix to the substrate.

In an embodiment, the step of dispensing the epoxy may include a step of pushing up the lower cover including an elastic material by using the pin.

In an embodiment, the step of dispensing the epoxy may include a step of raising the pin by using a driving device.

In an embodiment, the amount of epoxy coated on the lower surface of the electronic component may be determined based on a lift distance of the pin.

In an embodiment, the step of mounting the electronic component in the dispensing port may include a step of mounting the electronic component in the dispensing port having a width which is greater than a width of an internal space of the epoxy dispensing cylinder.

In another aspect of the present invention, there is provided a method of mounting an electronic component on a substrate by using an epoxy dispensing device, the method including: a step of pushing up a lower cover formed under an epoxy dispensing cylinder by using a pin to dispense epoxy through a dispensing port; a step of mounting an electronic component in the dispensing port; a step of coating the epoxy on a lower surface of the electronic component mounted in the dispensing port; and a step of moving the epoxy-coated electronic component to a mounting position of the electronic component by using a pickup device, and then, curing the epoxy coated on the lower surface of the electronic component with ultraviolet to fix to the substrate.

According to embodiments of the present invention, epoxy may be precisely coated on a lower portion of an electronic component in a mounting process of the electronic component, and thus, a yield rate may be enhanced, and a time taken in dispensing the epoxy may be shortened, thereby contributing to an increase in productivity.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION OF THE INVENTION

In the following description, the technical terms are used only for explain a specific exemplary embodiment while not limiting the present invention. The terms of a singular form may include plural forms unless referred to the contrary. The meaning of 'comprise', 'include', or 'have' specifies a property, a region, a fixed number, a step, a process, an element and/or a component but does not exclude other properties, regions, fixed numbers, steps, processes, elements and/or components.

Figure 1:
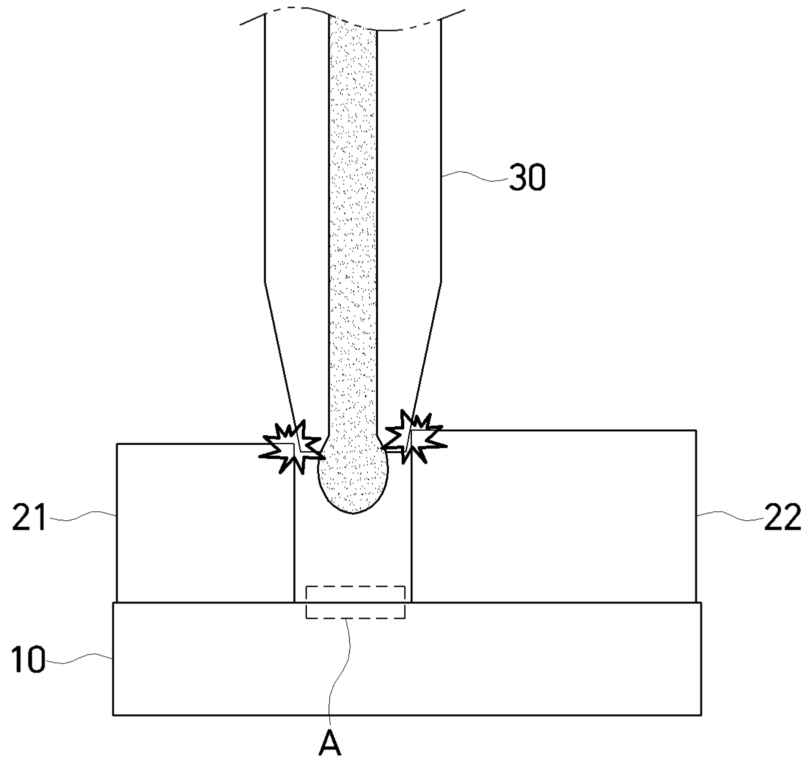
FIGS. 1 to 4 are diagrams for describing a problem of an electronic component mounting process of the related art.
Figure 2:
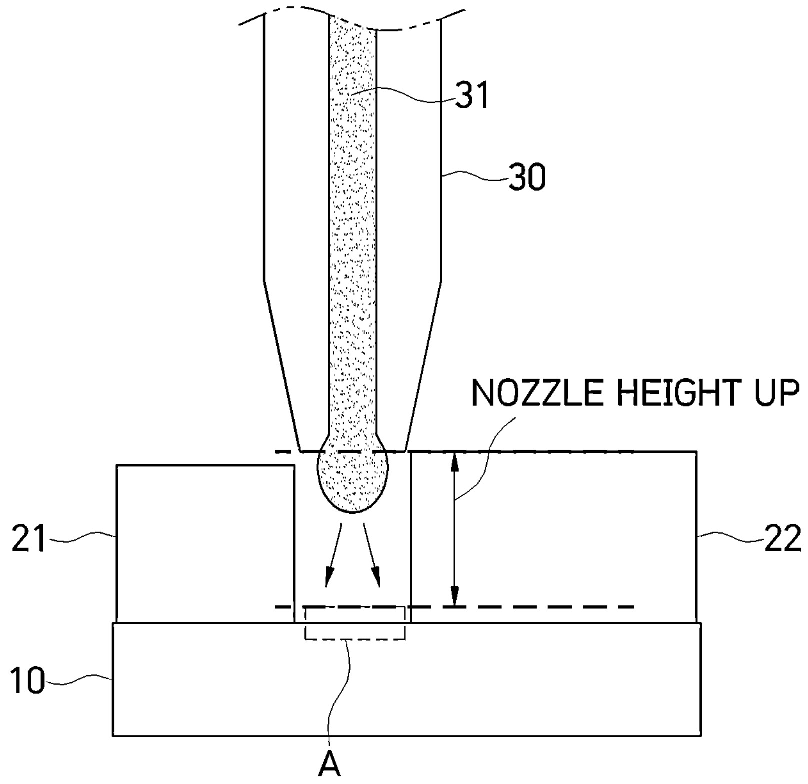
Figure 3:
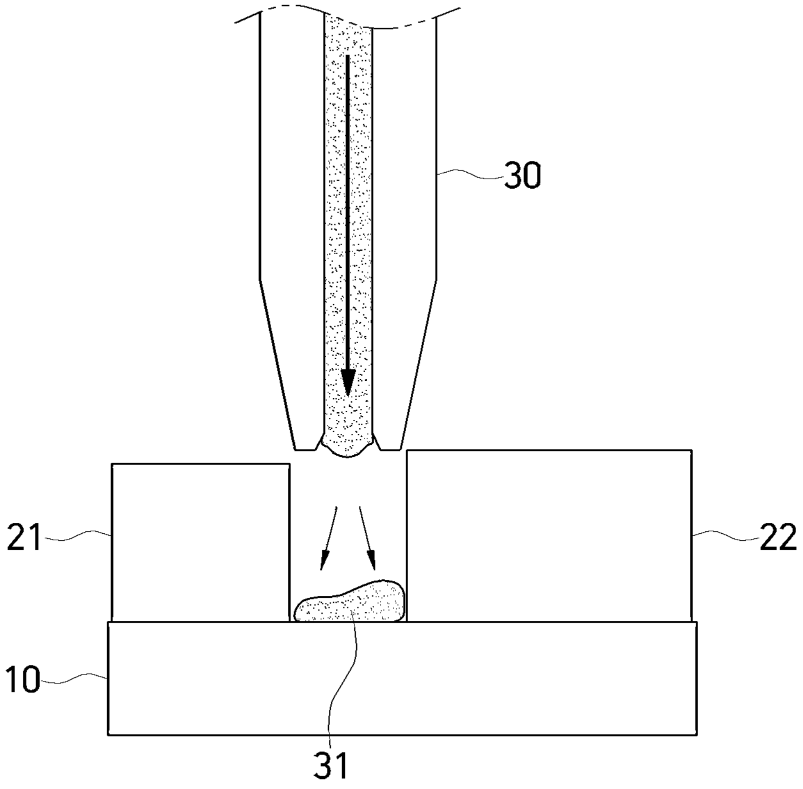
Figure 4:
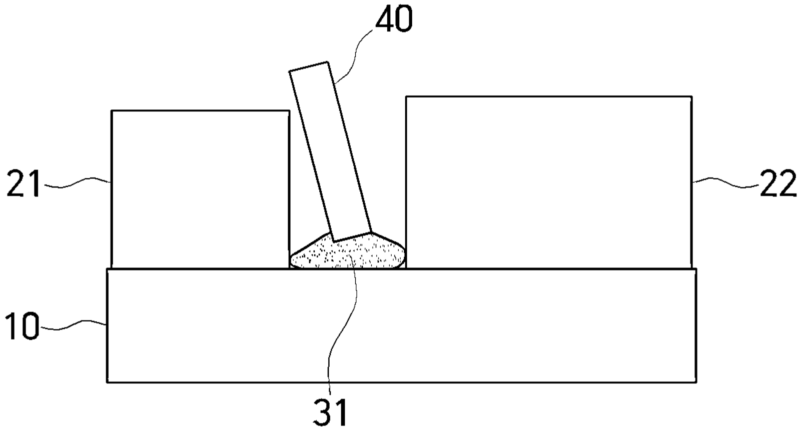
Figure 5:
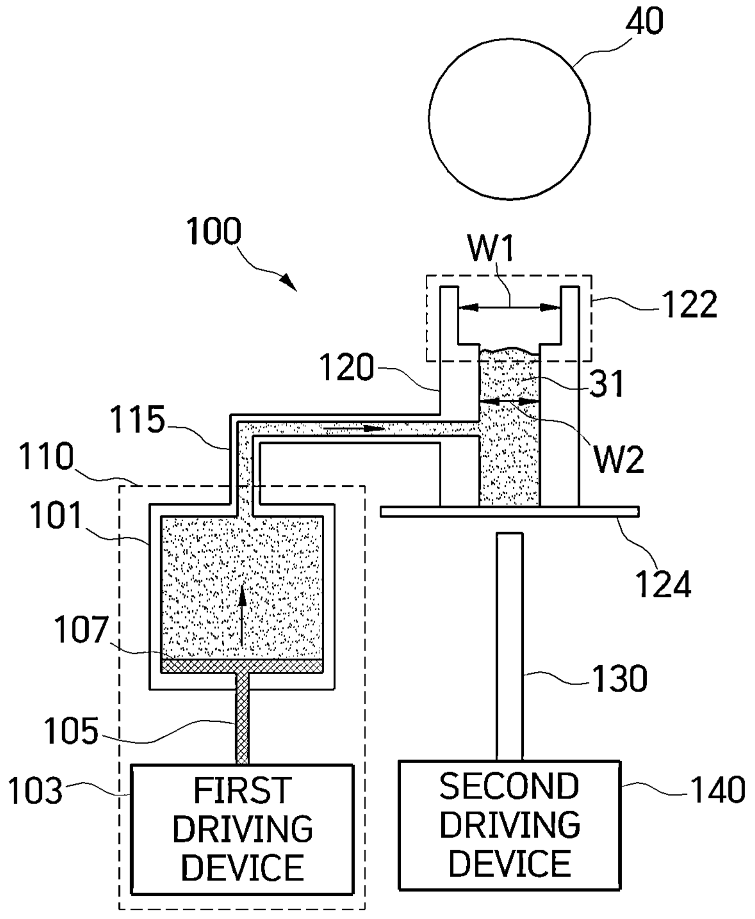
FIG. 5 is a diagram for describing an epoxy dispensing device according to an embodiment of the present invention.

FIG. 5 is a diagram for describing an epoxy dispensing device 100 according to an embodiment of the present invention.

Referring to FIG. 5, the epoxy dispensing device 100 according to an embodiment of the present invention may include an epoxy injector 110, a cylinder 120 (hereinafter referred to as a 'second cylinder' or an 'epoxy dispensing cylinder'), and a pin 130.

The epoxy injector 110 may inject epoxy 31 into the second cylinder 120 through a valve 115. To this end, the epoxy injector 110 may include, for example, a cylinder 101 (hereinafter referred to as a 'first cylinder'), a driving device 103 (hereinafter referred to as a 'first driving device'), a rod 105, and a piston 107.

The first cylinder 101 may include an internal space which accommodates epoxy 31 for injecting into the second cylinder 120. The epoxy 31 accommodated into the internal space of the first cylinder 101 may be injected into the second cylinder 120 through the valve 115, based on an ascending motion of the piston 107 disposed in the internal space of the first cylinder 101. The piston 107 may be raised by an ascending motion of the rod 105. The rod 105 may be raised by the driving device 103 (hereinafter referred to as a 'first driving device'). The first driving device 103 may be, for example, an electric motor. Although not shown, the epoxy dispensing device 100 may further include a gear which is between the electric motor and the rod 105 and transforms a rotating motion of a rotation shaft of the electric motor into a rectilinear reciprocating motion, and the rod 105 may perform an ascending and descending motion, based on a rectilinear reciprocating motion of the gear.

The second cylinder 120 may include an internal space which accommodates the epoxy 31 injected from the epoxy injector 110. The second cylinder 120 may have a shape where an upper portion and a lower portion are opened. The lower portion of the second cylinder 120 may be sealed by a lower cover 124. Here, the lower cover 124 may include an elastic material such as rubber.

The opened upper portion of the second cylinder 120 may function as a dispensing port 122 which dispenses epoxy, and an electronic component 40 to be mounted on a substrate may be accommodated therein. A width W1 of the dispensing port 122 may be formed to be greater than a width W2 of the internal space of the second cylinder 120, so that the epoxy 31 dispensed through the dispensing port 122 is uniformly coated on a lower surface of the electronic component 40.

An inner surface of the dispensing port 122 may be formed along a shape of the lower surface of the electronic component 40 so that the electronic component 40 having various shapes is stably mounted thereon. For example, in FIG. 5, the inner surface of the dispensing port 122 is illustrated in a rectangular shape, but when the electronic component 40 is an optical lens, the inner surface of the dispensing port 122 may be formed in a round shape. The electronic component 40 may include all kinds of circuit components having various shapes, which are used in various electronic devices as well as an optical transceiver.

Furthermore, the epoxy 31 accommodated into the second cylinder 120 may be dispensed through the dispensing port 122, based on ascending of the lower cover 124 including an elastic material. That is, the lower cover 124 may push up the epoxy 31 accommodated into the second cylinder 120, based on an elastic action, and thus, the epoxy 31 may be dispensed through the dispensing port 122, whereby the epoxy 31 may be coated on the lower surface of the electronic component 40 mounted in the dispensing port 122.

An elastic action of the lower cover 124 may occur based on an ascending motion of the pin 130, and the ascending motion of the pin 130 may be controlled by a driving device 140 (hereinafter referred to as a 'second driving device'). The second driving device 140 may be, for example, an electric motor. The epoxy dispensing device 100 may further include a gear which is between the electric motor and the pin 130 and transforms a rotating motion of a rotation shaft of the electric motor into a rectilinear reciprocating motion, and the pin 130 may perform an ascending and descending motion, based on a rectilinear reciprocating motion of the gear.

When epoxy is coated on the lower surface of the electronic component 40, the pin 130 may be lowered by the second driving device 140 to move to an original position, and thus, the lower cover 124 including an elastic material may be restored to an original shape.

The amount of epoxy dispensed through the dispensing port 122 (i.e., the amount of epoxy coated on the lower surface of the electronic component 40) may be determined based on a pin lift distance of the pin 130. Accordingly, the amount of epoxy coated on the lower surface of the electronic component 40 may be finely adjusted based on the pin lift distance of the pin 130.

Although not shown in FIG. 5, the epoxy dispensing device 100 may be configured to further include a controller which controls the driving devices 103 and 140 or a computing device including the controller. The controller may include at least one central processing unit (CPU) and at least one memory. The memory may store a program instruction for controlling an ascending and descending motion of each of the rod 105 and the pin 130, and the CPU may execute the program instruction input from the memory.

FIGS. 6 to 11 are diagrams for describing an operation process of the epoxy dispensing device of FIG. 5.

Figure 6:
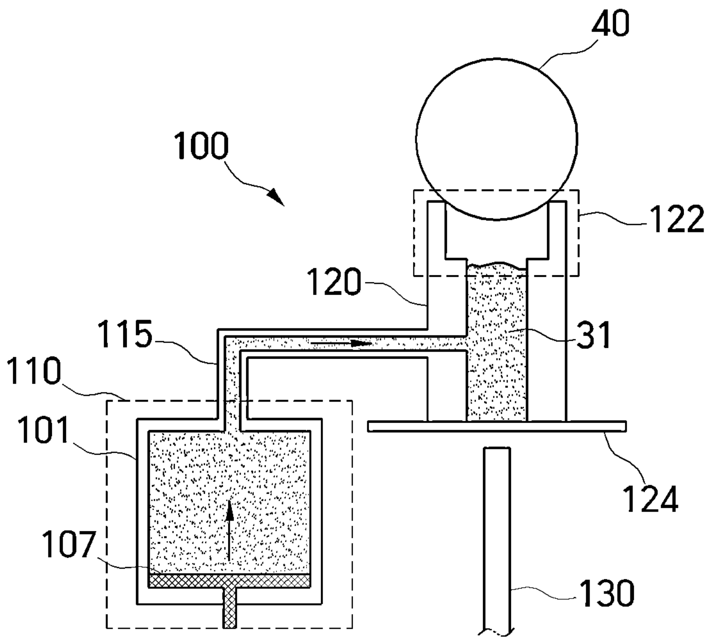
FIGS. 6 to 11 are diagrams for describing an operation process of the epoxy dispensing device of FIG. 5.

Referring to FIG. 6, first, the epoxy injector 110 may inject the epoxy 31 into the internal space of the second cylinder 120 through the valve 115, and then, the electronic component 40 may be mounted in the dispensing port 122 of the second cylinder 120. At this time, the electronic component 40 may be mounted in the dispensing port 122 of the second cylinder 120 by a pickup device 150 which will be described below.

Figure 7:
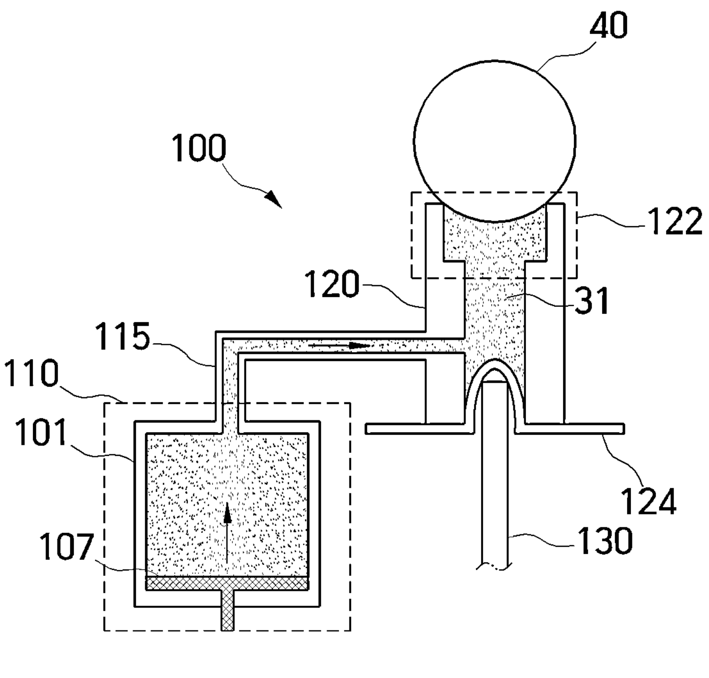

Subsequently, referring to FIG. 7, the pin 130 disposed at a lower portion of the second cylinder 120 may push up the lower cover 124 including an elastic material to dispense the epoxy 31 in an upward direction through the dispensing port 122.

Figure 8:
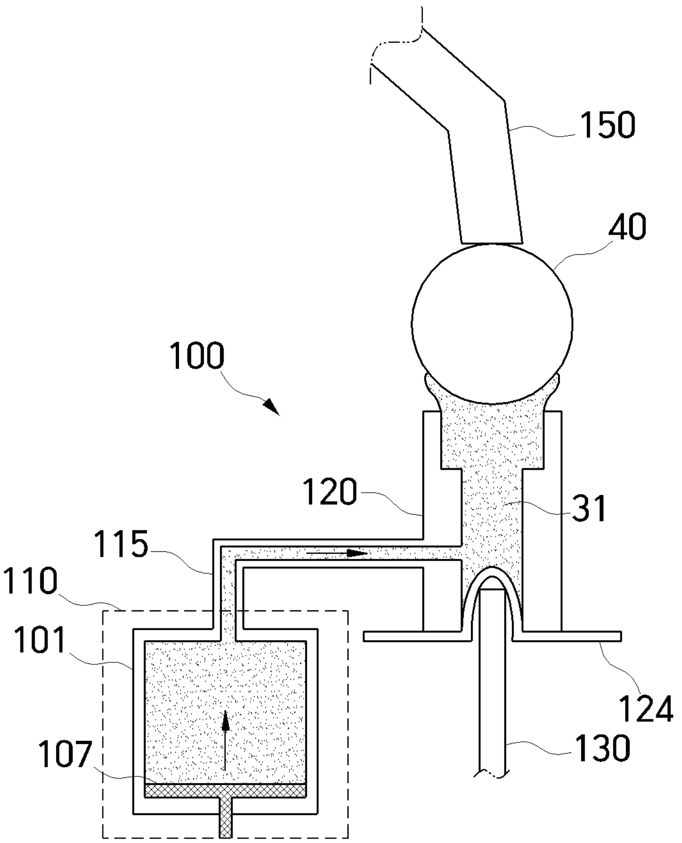

Subsequently, referring to FIG. 8, as the epoxy 31 is dispensed in an upward direction through the dispensing port 122, the epoxy 31 may be coated on the lower surface of the electronic component 40 mounted in the dispensing port 122, and the pickup device 150 may move to the electronic component 40. Here, the pickup device 150 may be a robot arm including a gripper which may grip the electronic component 40.

Figure 9:
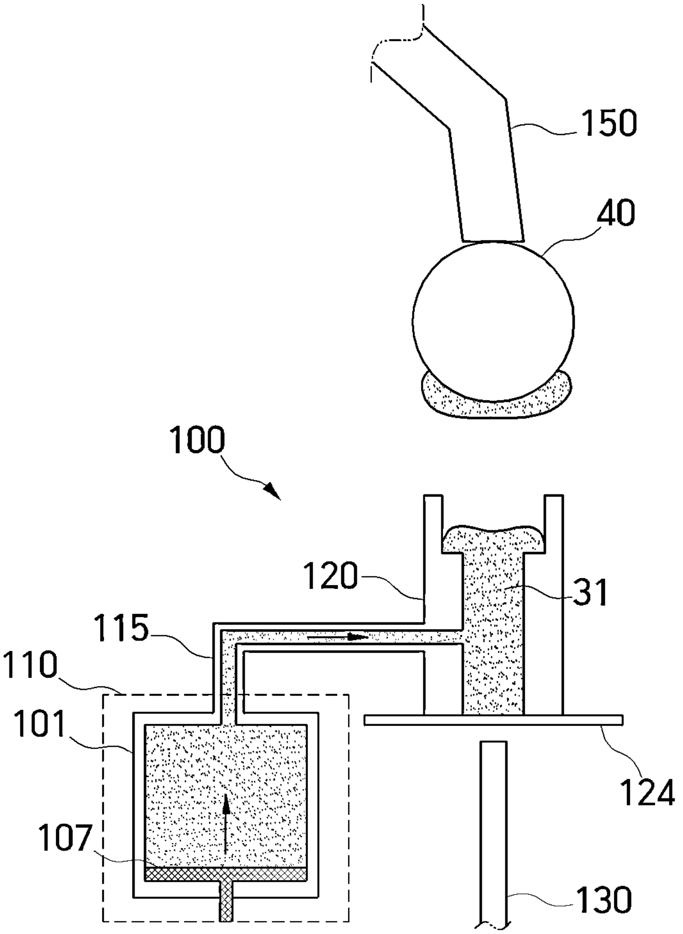

Subsequently, referring to FIG. 9, the pickup device 150 may pick up the electronic component 40 on which the epoxy 31 is coated. Also, the pin 130 may be lowered to move to an original position.

Figure 10:
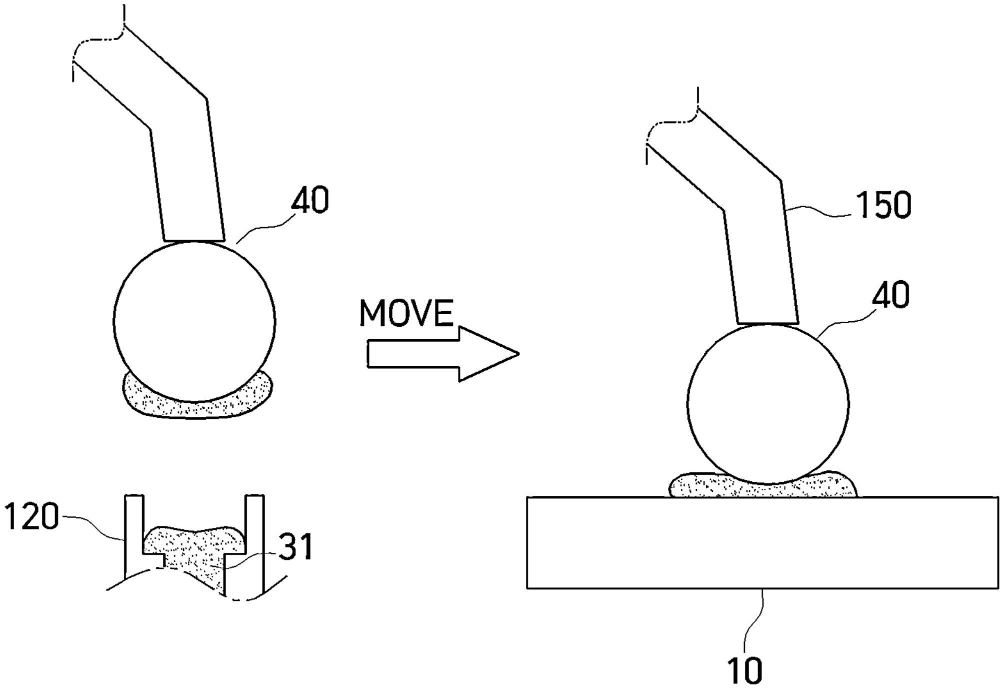

Subsequently, referring to FIG. 10, the pickup device 150 may move the electronic component 40, on which the epoxy 31 is coated, to a mounting position on the substrate 10.

Figure 11:
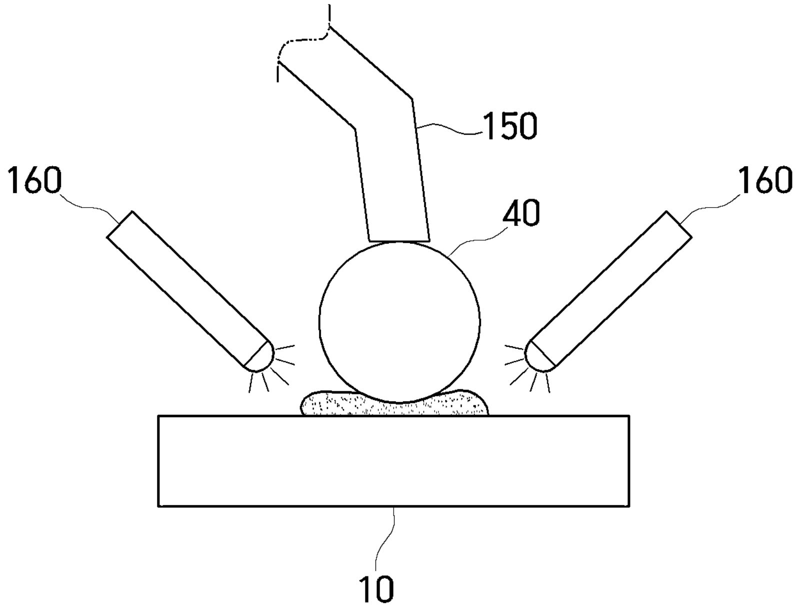

Subsequently, referring to FIG. 11, the epoxy coated on the lower surface of the electronic component 40 moving to the mounting position may be cured by ultraviolet of an ultraviolet lamp 160, and thus, the electronic component 40 may be fixed to the mounting position. The pickup device 150 may be detached from the electronic component 40 fixed to the mounting position.

Figure 12:
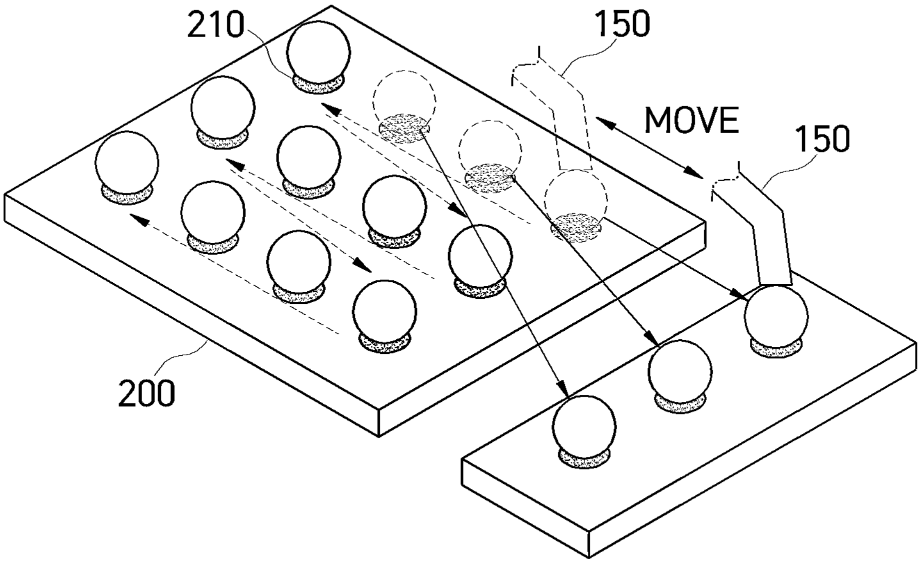
FIG. 12 is a diagram for describing an epoxy dispensing device according to another embodiment of the present invention.

FIG. 12 is a diagram for describing an epoxy dispensing device according to another embodiment of the present invention.

Referring to FIG. 12, the epoxy dispensing device according to another embodiment of the present invention may be designed to coat epoxy on a lower surface of each of a plurality of electronic components. To this end, as illustrated in FIG. 12, the second cylinder 120 illustrated in FIG. 5 may be formed of a plate member 200.

The plate member 200 may include internal spaces corresponding to the internal space of the second cylinder 120 illustrated in FIG. 5, and the internal spaces may be arranged in a matrix form. A dispensing port 210 corresponding to the dispensing portion 122 of the second cylinder 120 illustrated in FIG. 5 may be formed in an upper portion of each internal space, and a lower cover of an elastic material corresponding to the lower cover 124 of an elastic material illustrated in FIG. 5 may be formed in a lower portion of each internal space. Although not shown, a plurality of pins which are arranged in a matrix form and correspond to the pin 130 of FIG. 5 may be disposed under the plate member 200. As described above, the epoxy dispensing device according to another embodiment of the present invention may be configured to coat epoxy on a lower surface of each of a plurality of electronic components, and thus, may be used for massive production.

Figure 13:
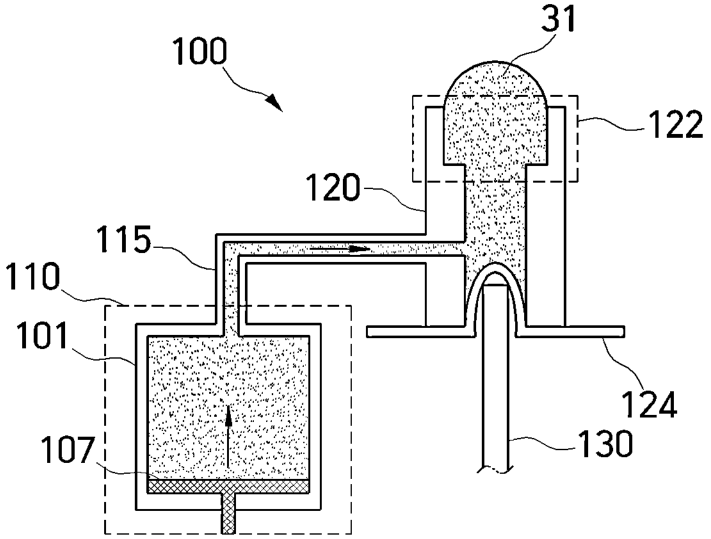
FIGS. 13 to 15 are diagrams for describing an operation process of an epoxy dispensing device according to another embodiment of the present invention.
Figure 14:
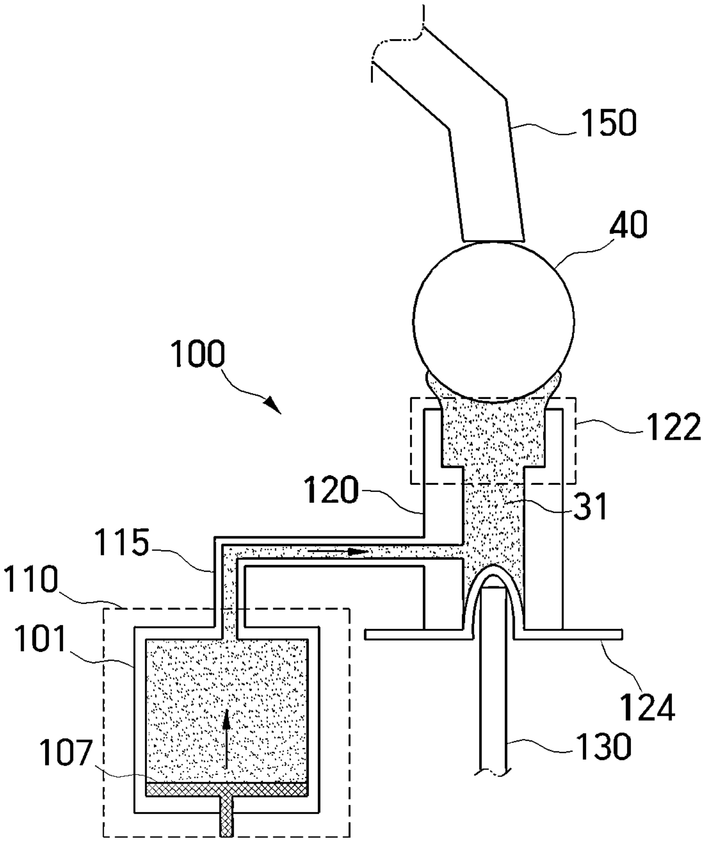
Figure 15:
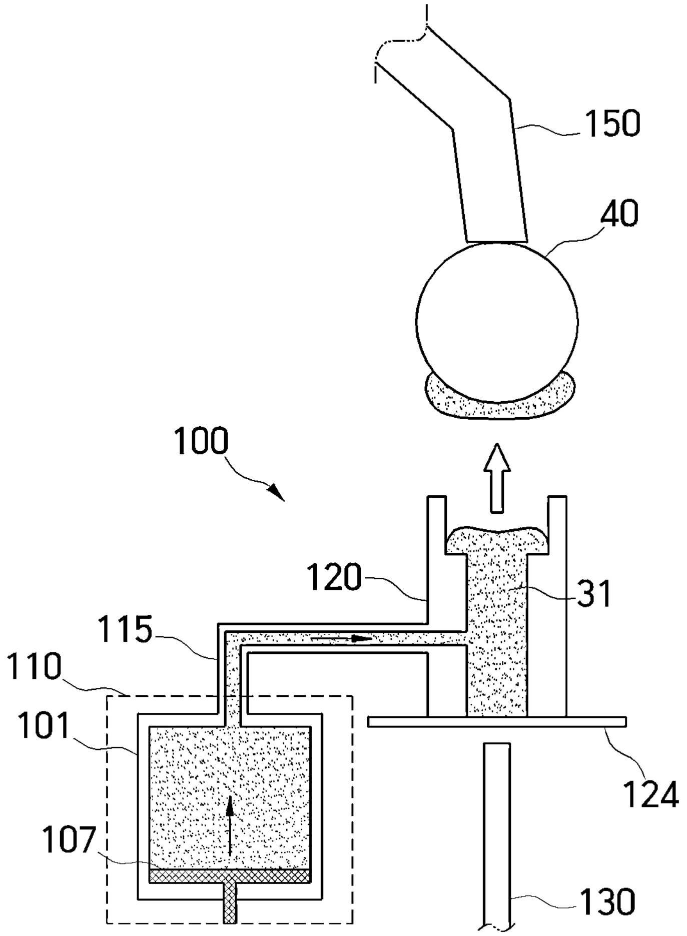

FIGS. 13 to 15 are diagrams for describing an operation process of an epoxy dispensing device according to another embodiment of the present invention.

An operation process of an epoxy dispensing device according to another embodiment of the present invention may dispense epoxy through a dispensing port and may place an electronic component in the dispensing port, and thus, may have a difference with the embodiment described above with reference to FIGS. 6 to 11.

First, referring to FIG. 13, a pin 130 disposed under a second cylinder 120 may push up a lower cover 124 of an elastic material to dispense epoxy 31 in an upward direction through a dispensing port 122.

Subsequently, referring to FIG. 14, in a state where the epoxy 31 is dispensed in an upward direction with respect to the dispensing port 122, a pickup device 150 may place an electronic component 40 in the dispensing port 122. Then, the epoxy 31 may be coated on a lower surface of the electronic component 40. Subsequently, the pin 130 may be lowered to move to an original position.

Subsequently, referring to FIG. 15, the pickup device 150 may pick up the electronic component 40 on which the epoxy 31 is coated, and then, like a process described above with reference to FIGS. 10 and 11, the epoxy coated on the lower surface of the electronic component 40 may be cured and may be fixed to a substrate. Subsequently, the pickup device 150 may be detached from the electronic component 40.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An epoxy dispensing device comprising:

a cylinder configured to accommodate epoxy;

a lower cover configured to seal a lower portion of the cylinder; and a pin disposed under the lower cover, wherein the pin pushes up the lower cover to coat the epoxy on a lower surface of an electronic component mounted in a dispensing port formed in an upper portion of the cylinder.

2. The epoxy dispensing device of claim 1, wherein the lower cover comprises an elastic material.

3. The epoxy dispensing device of claim 1, wherein a width of the dispensing port is greater than a width of an internal space of the cylinder.

4. The epoxy dispensing device of claim 1, wherein a dispensing amount of the epoxy coated on the lower surface of the electronic component is determined based on a lift distance of the pin.

5. The epoxy dispensing device of claim 1, further comprising a driving device configured to control an ascending motion of the pin.

6. A method of mounting an electronic component on a substrate by using an epoxy dispensing device, the method comprising:

a step of mounting an electronic component in a dispensing port formed in an upper portion of an epoxy dispensing cylinder;

a step of pushing up a lower cover formed under the epoxy dispensing cylinder by using a pin to dispense the epoxy through the dispensing port;

a step of coating the epoxy on a lower surface of the electronic component mounted in the dispensing port by using the dispensed epoxy; and a step of moving the epoxy-coated electronic component to a mounting position of the electronic component by using a pickup device, and then, curing the epoxy coated on the lower surface of the electronic component with ultraviolet to fix to the substrate.

7. The method of claim 6, wherein the step of dispensing the epoxy comprises a step of pushing up the lower cover including an elastic material by using the pin.

8. The method of claim 6, wherein the step of dispensing the epoxy comprises a step of raising the pin by using a driving device.

9. The method of claim 6, wherein the amount of epoxy coated on the lower surface of the electronic component is determined based on a lift distance of the pin.

10. The method of claim 6, wherein the step of mounting the electronic component in the dispensing port comprises a step of mounting the electronic component in the dispensing port having a width which is greater than a width of an internal space of the epoxy dispensing cylinder.

11. A method of mounting an electronic component on a substrate by using an epoxy dispensing device, the method comprising:

a step of pushing up a lower cover formed under an epoxy dispensing cylinder by using a pin to dispense epoxy through a dispensing port;

a step of mounting an electronic component in the dispensing port;

a step of coating the epoxy on a lower surface of the electronic component mounted in the dispensing port; and a step of moving the epoxy-coated electronic component to a mounting position of the electronic component by using a pickup device, and then, curing the epoxy coated on the lower surface of the electronic component with ultraviolet to fix to the substrate.

* * * * *